(12) United States Patent
Borozdin

(10) Patent No.: US 10,872,746 B2
(45) Date of Patent: Dec. 22, 2020

(54) SYSTEM OF MOBILE CHARGED PARTICLE DETECTORS AND METHODS OF SPENT NUCLEAR FUEL IMAGING

(71) Applicant: Decision Sciences International Corporation, Poway, CA (US)

(72) Inventor: Konstantin Borozdin, Albuquerque, NM (US)

(73) Assignee: Decision Sciences International Corporation, Poway, CA (US)

(*) Notice: Subject to any disclaimer, the term of this patent is extended or adjusted under 35 U.S.C. 154(b) by 64 days.

(21) Appl. No.: 16/674,891

(22) Filed: Nov. 5, 2019

(65) Prior Publication Data

US 2020/0144023 A1 May 7, 2020

Related U.S. Application Data

(63) Continuation of application No. PCT/US2019/059730, filed on Nov. 4, 2019.

(Continued)

(51) Int. Cl.
*H01J 37/244* (2006.01)
*G01N 23/04* (2018.01)

(52) U.S. Cl.
CPC .......... *H01J 37/244* (2013.01); *G01N 23/04* (2013.01); *G01N 2223/626* (2013.01); *H01J 2237/24455* (2013.01); *H01J 2237/24495* (2013.01)

(58) Field of Classification Search
CPC .......... H01J 37/244; H01J 2237/24455; H01J 2237/24495; G01N 23/04

(Continued)

(56) References Cited

U.S. PATENT DOCUMENTS

2001/0021241 A1  9/2001 Swift et al.
2009/0074138 A1  3/2009 Knoespel et al.
(Continued)

OTHER PUBLICATIONS

International Search Report and Written Opinion dated Mar. 30, 2020 in International Patent Application No. PCT/US19/59730, 10 pages.

*Primary Examiner* — Nicole M Ippolito
(74) *Attorney, Agent, or Firm* — Perkins Coie LLP

(57) ABSTRACT

Systems, devices and methods for inspecting and imaging of contents of a volume is disclosed. One implementation of the disclosed systems, devices and methods includes an apparatus for inspecting and imaging of contents of a volume of interest which includes a first particle tracking unit of detectors to receive incoming charged particles that transit through an object and to measure position and direction of the charged particles that transit through the object while allowing the charged particles to pass through, and a second particle tracking unit of detectors installed relative to the first particle tracking unit of detectors and to the volume of interest containing the object of inspection so that it is positioned to receive the outgoing charged particles that transit through the first particle tracking unit and transit through the object of inspection and to measure a position and a direction of the outgoing charged particles. The apparatus also includes a processor that processes information from the first and second particle tracking units of detectors to yield an estimate of a spatial map of atomic number and a density of the object. The methods disclosed here include triggering algorithms for signal selection, positional calibration algorithms for locating particle tracking units in absolute three dimensional coordinate space, and three-dimensional tomographic image reconstruction algorithms combining the tracking information from multiple pairs of particle tracking units.

21 Claims, 7 Drawing Sheets

Related U.S. Application Data

(60) Provisional application No. 62/755,180, filed on Nov. 2, 2018.

(58) Field of Classification Search
USPC .... 250/305, 306, 307, 309, 310, 311, 492.1, 250/492.3, 396 R, 397
See application file for complete search history.

(56) References Cited

U.S. PATENT DOCUMENTS

| | | | |
|---|---|---|---|
| 2012/0292503 A1* | 11/2012 | Phifer, Jr. | H01J 37/222 |
| | | | 250/307 |
| 2012/0312985 A1 | 12/2012 | Morris et al. | |
| 2013/0037715 A1* | 2/2013 | Boughorbel | H01J 37/28 |
| | | | 250/307 |
| 2015/0246244 A1 | 9/2015 | Sossong et al. | |
| 2015/0279489 A1 | 10/2015 | Milner et al. | |
| 2016/0216398 A1 | 7/2016 | Bendahan et al. | |

* cited by examiner

SYSTEM OF MOBILE CHARGED PARTICLE DETECTORS AND METHODS OF SPENT NUCLEAR FUEL IMAGING

PRIORITY CLAIM AND RELATED PATENT APPLICATION INFORMATION

This patent document is a continuation of, and claims priority to and benefits of International Patent Application No. PCT/US19/59730 entitled "SYSTEM OF MOBILE CHARGED PARTICLE DETECTORS AND METHODS OF SPENT NUCLEAR FUEL IMAGING," filed on Nov. 4, 2019, which further claims the priority and benefits of U.S. Provisional Patent Application No. 62/755,180 entitled "SYSTEM OF MOBILE CHARGED PARTICLE DETECTORS AND METHODS OF SPENT NUCLEAR FUEL IMAGING" and filed by Applicant and Assignee Decision Sciences International Corporation on Nov. 2, 2018, The entire contents of the above two patent applications are hereby incorporated by reference as part of the disclosure of this document.

FEDERALLY SPONSORED RESEARCH OR DEVELOPMENT

No part of this invention was made with government support. The government has no certain rights in the invention.

TECHNICAL FIELD

This patent document relates to the field of imaging and inspecting various items with charged particle detectors.

BACKGROUND

Naturally occurring cosmic ray muons on the earth surface can be used for various detection and inspection applications.

SUMMARY

This patent document discloses hardware and techniques that can be implemented to provide apparatus, systems, and methods for detection of materials, including but not limited to special nuclear materials, by measuring multiple coulomb scattering and attenuation of charged particles traversing a volume of interest.

In some implementations of the disclosed hardware and techniques, a volume of interest may contain a cask with spent nuclear fuel. The apparatus, system and methods disclosed here are not limited to or depend on the particular type of the object, and the use of the cask as the object should therefore be considered as an example rather than an essential element of the disclosed hardware and techniques. Nevertheless, in various implementations, the apparatus, system and methods can be configured or optimized to the particular case of dry storage casks inspection.

In various applications, the apparatus, system and methods disclosed here can be implemented to use charged particles that are components of cosmic-rays as the probe to inspect the volume of interest and provide three-dimensional mapping of various materials, including, but not limited to, special nuclear materials. The usage of cosmic-ray particles has several important advantages.

One of important qualities of the disclosed apparatus is that it does not generate any artificial radiation using instead naturally occurring cosmic-ray flux as a probe to image the volume of interest. It makes the apparatus safe for any humans, other living organisms and material objects.

In one aspect, the disclosed hardware and techniques can be implemented to construct an apparatus for inspecting and imaging contents of a volume of interest to include a first particle tracking unit of detectors located to receive incoming charged particles that further transit through an object of inspection contained in the volume of interest; a second particle tracking unit of detectors located lower relative to the first particle tracking unit of detectors and on a side of the volume of interest opposite the first particle tracking unit of detectors, enabled to receive the charged particles that transit through the first particle tracking unit of detectors and transit through the object and to measure a position and a direction of each charged particle; and a mechanical support structure to keep both the first particle tracking unit of detectors and the second particle tracking unit of detectors in position wherein the first and second particle tracking units of detectors are enabled to receive the charged particles. A processor is also coupled to both the first particle tracking unit of detectors and the second particle tracking unit of detectors to process information from the first and second particle tracking units of detectors to yield an estimate of a spatial map of an atomic number and a density of the object. In one implementation of this apparatus, the mechanical support structure can include at least two mobile assemblies to provide mobility and support for the first and second particle tracking units of detectors, the mechanical support structure in a generally vertical orientation wherein the first particle tracking unit of detectors is positioned higher than the second particle tracking unit of detectors, the mechanical support structure enabled to provide geometrical rigidity to the at least two mobile assemblies during the inspection.

In another aspect, the disclosed hardware and techniques can be implemented to provide a method of operating an inspection apparatus that includes positioning an assembly of the first and second particle tracking sensitive units of detectors around the object of inspection to form a system of particle tracking sensitive units by using first and second mobile support structures to hold the first and second particle tracking sensitive units of detectors, respectively, to allow for adjustment of positions of the first and second particle tracking sensitive units of detectors; receiving at a first particle tracking sensitive unit of detectors, incoming charged particles that further transit through an object of inspection and through a second particle tracking sensitive unit of detectors located lower relative to the first particle tracking detector and to a volume of interest containing the object of inspection; and measuring a position and a direction of each of the charged particles that transit through the object and the first and second particle tracking sensitive units. This method further includes collecting the position and the direction of a plurality of charged particles; processing the position and the direction of the plurality of charged particles as numerical data based on electrical signals generated in the first and second particle tracking sensitive unit of detectors; determining points of interaction of each charged particle with the first and second particle tracking sensitive unit of detectors; approximating an incoming trajectory of each charged particle with a straight line based on the determined points of interaction of each charged particle with the first particle tracking sensitive units; approximating an outgoing trajectory of each charged particle with a straight line based on the determined points of interaction of each charged particle with the second particle tracking sensitive unit of detectors; and reconstructing a spatial map of material properties based on densities and radiation lengths of the object in the volume of interest and based on the collection of incoming and outgoing particle trajectories.

Various features and implementations of the disclosed apparatus, systems, and methods are disclosed in greater detail in the drawings, the description and the claims.

DETAILED DESCRIPTION

Figure 1:
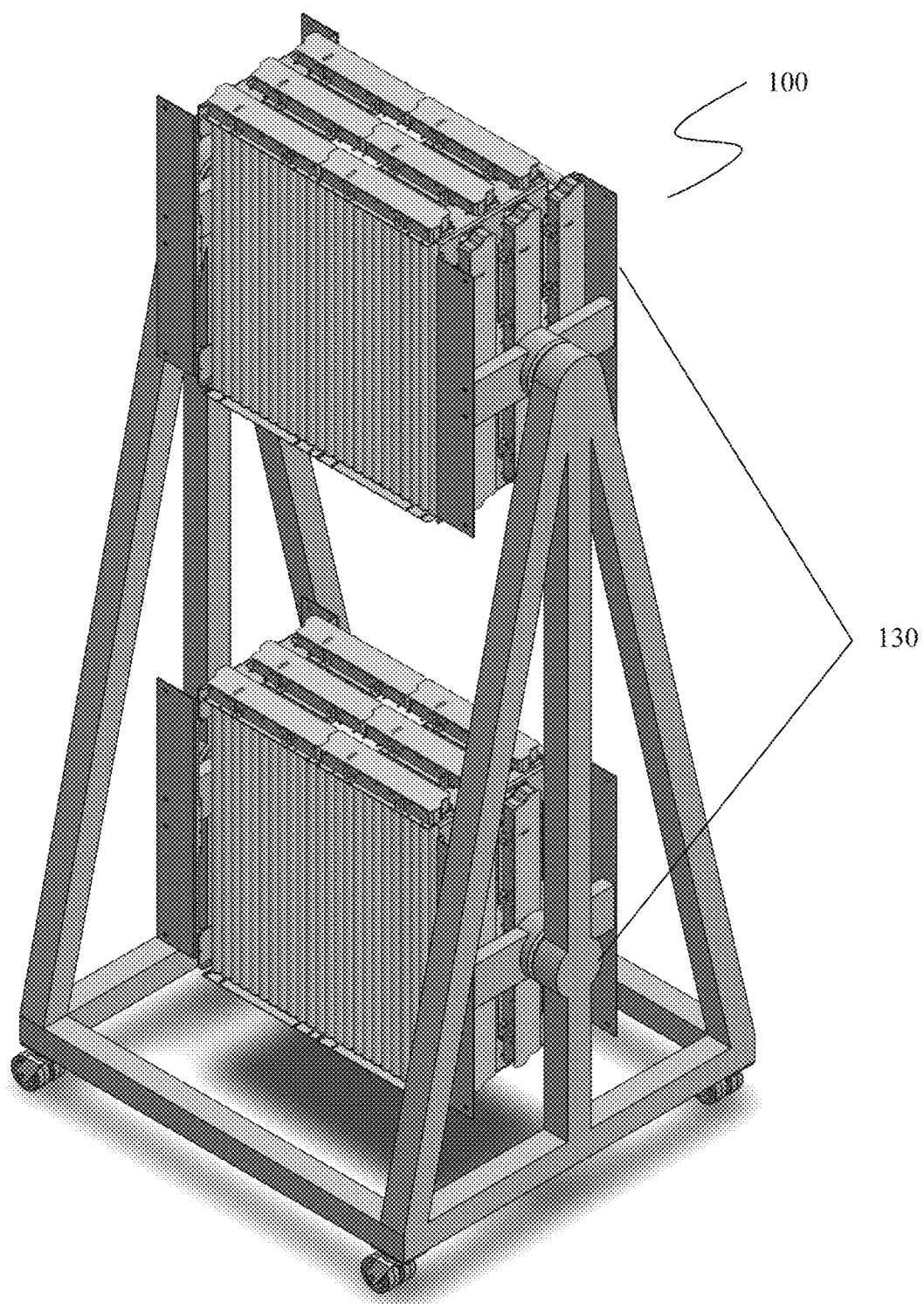
FIG. 1 shows an exemplary conceptual design of a mobile assembly containing two sensitive detector units (supermodules) installed in vertical orientation with a gap between them.

The disclosed hardware and techniques for inspecting materials, including the use of mobile charged particle detectors, can be used in a wide range application. One of such applications is detecting special nuclear materials.

Large quantities of radioactive heavy metals are produced by nuclear reactors around the world annually contributing to ever-increasing global inventory of nuclear waste. This high-level radioactive waste is commonly held in long-term storage within large, heavily shielded casks. Confinement of the material within casks is very important for at least two reasons: 1) nuclear waste is extremely toxic material, with radioactive components of extremely long life and therefore is a major threat for public safety if not contained; 2) components of nuclear waste are special nuclear materials that can be used in creating nuclear weapons. Currently, international nuclear safeguards inspectors have no stand-alone method of verifying the amount of reactor fuel stored within a sealed cask. Measurements of the scattering angles of cosmic ray muons which pass through a storage cask can be used to measure the amount of special nuclear material in the cask and determine if spent fuel assemblies are missing without opening the cask. The apparatus, system and methods disclosed here provide a potential solution to this long-standing problem in international nuclear safeguards, providing safe, reliable, efficient and economically viable method of inspection. The apparatus, system and methods disclosed here provide a potential solution to long-standing problem of nuclear accountancy in international nuclear safeguards. Furthermore, they can additionally help with the assessment of the cask structural integrity, as well as the structural integrity of the fuel elements stored inside.

Technical features described in this patent document can be used to construct various particle detection systems. For example, a particle detection system can include an object holding area for placing an object to be inspected, a first set of position sensitive muon detectors located on a first side of the object holding area to measure positions and directions of incident muons towards the object holding area, a second set of position sensitive muon detectors located on a second side of the object holding area opposite to the first side to measure positions and directions of outgoing muons exiting the object holding area, and a signal processing unit, which may include, e.g., a microprocessor, to receive data of measured signals of the incoming muons from the first set of position sensitive muon detectors and measured signals of the outgoing muons from the second set of position sensitive muon detectors. As an example, each of the first and second sets of particle detectors can be implemented to include drift tubes arranged to allow at least three charged particle positional measurements in a first direction and at least three charged particle positional measurements in a second direction different from the first direction. The signal processing unit is configured to analyze scattering behaviors of the muons caused by scattering of the muons in the materials within the object holding area based on the measured incoming and outgoing positions and directions of muons to obtain a tomographic profile or the spatial distribution of scattering centers within the object holding area. The obtained tomographic profile or the spatial distribution of scattering centers can be used to reveal the presence or absence of one or more objects in the object holding area such as materials with high atomic numbers including nuclear materials or devices. Each position sensitive muon detector can be implemented in various configurations, including drift cells such as drift tubes filled with a gas which can be ionized by muons. Such a system can be used to utilize natural cosmic ray-produced muons as the source of muons for detecting one or more objects in the object holding area.

Another example of a particle detection system based on features described in this application can include an object holding area for placing an object to be inspected, a first set of particle detectors located on a first side of the object holding area to measure incident muons towards the object holding area and to respond to a neutron to measure neutrons, and a second set of particle detectors located on a second side of the object holding area opposite to the first side to measure outgoing muons exiting the object holding area and to respond to a neutron to measure neutrons. Each particle detector includes a muon sensitive material to measure muons and a neutron sensitive material to measure neutrons and is operable to simultaneously measure both muons and neutrons. This system includes a signal processing unit to receive and process data of measured signals from the first and second sets of detectors to produce a measurement of one or more objects in the object holding area. In one implementation, each particle detector can be a drift tube filled with a mixture of a muon sensitive gas and a neutron sensitive gas and operates as a position sensitive detector. Each set of particle detectors can be designed as a set of position sensitive detectors to measure positions and directions of received muons. For example, each of the first and second sets of particle detectors can be implemented to include drift tubes arranged to allow at least three charged particle positional measurements in a first direction and at least three charged particle positional measurements in a second direction different from the first direction. The signal processing unit can be configured to obtain tomographic profile or the spatial distribution of the material of one or more objects in the object holding area such as materials with high atomic numbers including nuclear materials or devices. Such a system can be used to utilize natural cosmic ray-produced muons as the source of muons for detecting one or more objects in the object holding area. In some applications, such a system can be configured to use one or more artificial sources of particles to produce the muons or neutrons for detecting one or more objects in the object holding area.

Cosmic ray tomography is a technique which exploits the multiple Coulomb scattering of highly penetrating cosmic ray-produced muons to perform non-destructive inspection of the material without the use of artificial radiation. The Earth is continuously bombarded by energetic stable particles, mostly protons, coming from deep space. These particles interact with atoms in the upper atmosphere to produce showers of particles that include many short-lived pions which decay producing longer-lived muons. Muons interact with matter primarily through the Coulomb force having no nuclear interaction and radiating much less readily than electrons. They lose energy only slowly through electromagnetic interactions. Consequently, many of the cosmic ray-produced muons arrive at the Earth's surface as highly penetrating charged radiation. The muon flux at sea level is about 1 muon per cm2 per minute. As a muon moves through material, Coulomb scattering off of the charges of sub-atomic particles perturb its trajectory. The total deflection depends on several material properties, but the dominant effect is the atomic number, Z, of nuclei. The trajectories are more strongly affected by materials that make good gamma ray shielding (such as lead and tungsten for example) and by special nuclear material (SNM), that is, uranium and plutonium, than by materials that make up more ordinary objects such as water, plastic, aluminum and steel.

Each muon carries information about the objects that it has penetrated, and by measuring the scattering of multiple muons one can probe the properties of these objects. A material with a high atomic number Z and a high density can be detected and identified when the material is located, inside low-Z and medium-Z matter. Coulomb scattering from atomic nuclei results in a very large number of small angle deflections of charged particles as the transit the matter. Enrico Fermi found and solved a transport equation that describes this process to a good approximation. The result is a correlated Gaussian distribution function for the displacement and angle change of the trajectory that depends on the density and the atomic charge of the material. The width of the distribution function is proportional to the inverse of the momentum of the particle and the square root of the real density of material measured in radiation lengths.

FIGS. 1 through 5 illustrate examples of various features of the disclosed hardware and techniques for inspecting materials, including the use of mobile charged particle detectors. Some aspects of the technical features are disclosed in examples in other U.S. patents, including, U.S. Pat. No. 7,633,062 entitled "RADIATION PORTAL MONITOR SYSTEM AND METHOD," U.S. Pat. No. 8,288,721 entitled "IMAGING AND SENSING BASED ON MUON TOMOGRAPHY," PCT Patent Publication No. WO 2008/123892 A2 entitled "PARTICLE DETECTION SYSTEMS AND METHODS," PCT Patent Publication No. WO 2008/118208 A2 entitled "DETERMINATION OF TRAJECTORY OF A CHARGED PARTICLE," PCT Patent Publication No. WO 2008/140559 A2 entitled "MEASURING MOMENTUM FOR CHARGED PARTICLE TOMOGRAPHY," and U.S. Pat. No. 8,536,527 entitled "IMAGING BASED ON COSMIC-RAY PRODUCED CHARGED PARTICLES." The entirety of each of the above listed patents and patent publications is incorporated by reference as part of the disclosure of this patent document.

Figure 4:
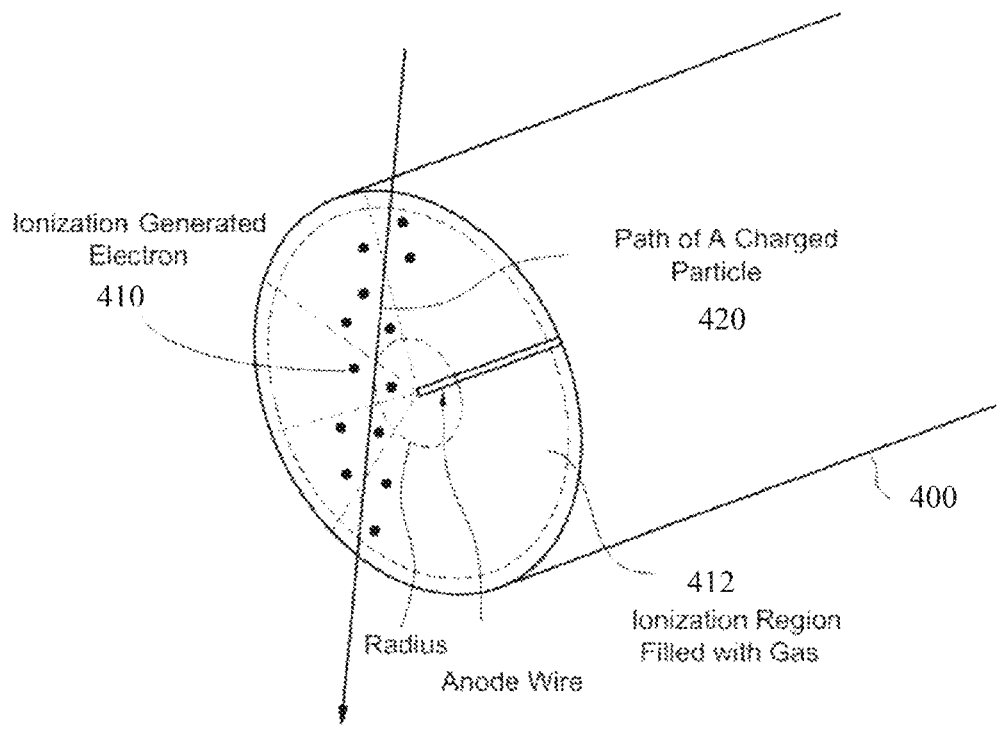
FIG. 4 illustrates an exemplary design of a drift tube that can be used to implement the disclosed technology.

In an exemplary embodiment of the apparatus, the charged particle detectors may be implemented in the form of gas-filled drift tubes 400 as shown, for example in FIG. 4, to detect charged particles 410. Drift tubes provide reliable and inexpensive area coverage to measure positions of charged particles interacting with the gas 412 inside them. In an exemplary embodiment of the apparatus, the drift tubes are sealed and filled with a non-flammable gas 412 as a safety precaution for operation in the presence of special nuclear materials. Other detector technologies may be used instead of or in conjunction with drift tubes as a part of the detection system. For example, the present apparatus may use silicon wafer, thin-gap chamber (TGC) and Thick Gas Electron Multiplier (THGEM) detectors.

Figure 5:
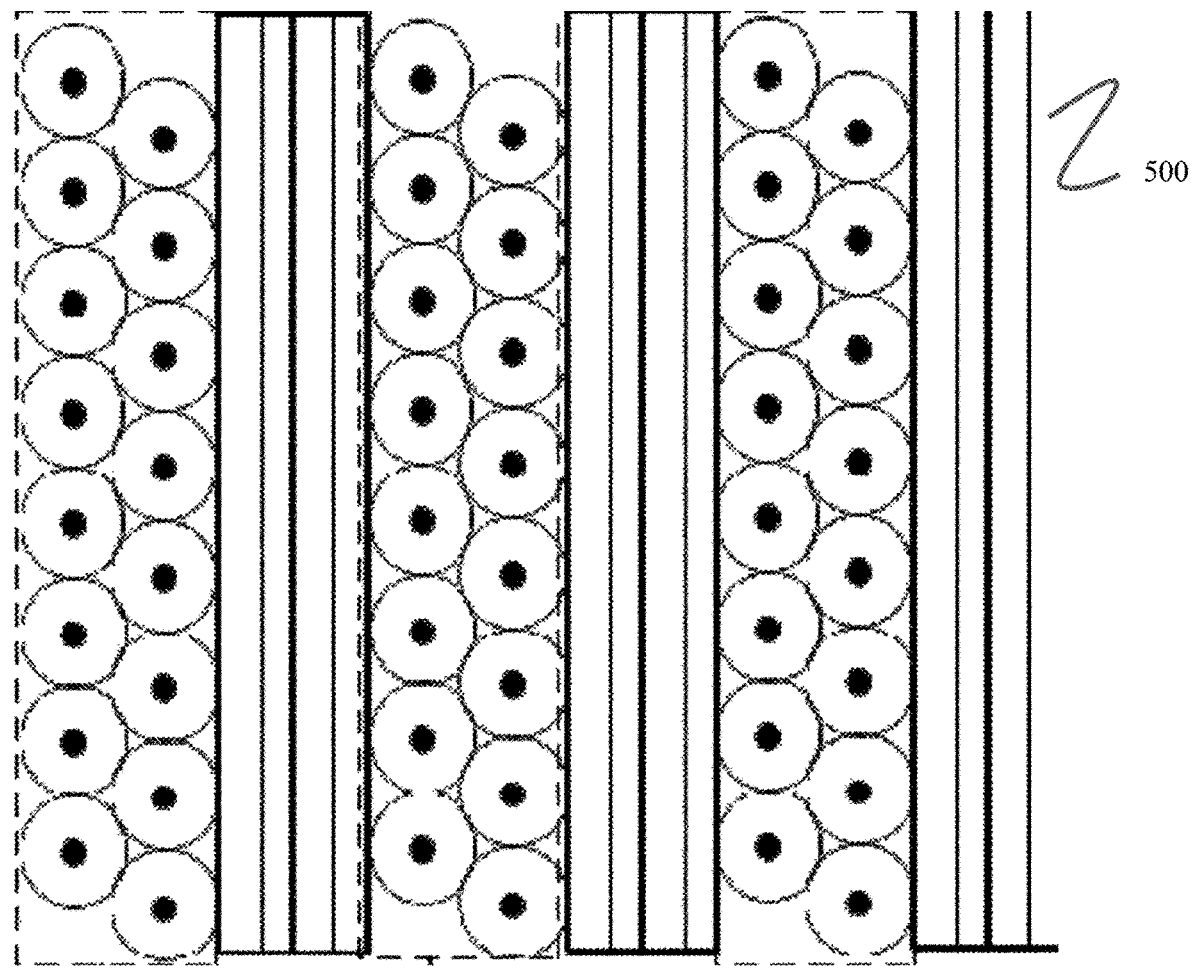
FIG. 5 illustrates an exemplary design of a sensitive detector unit module including a plurality of drift tubes that can be used to implement the disclosed technology.

In a typical embodiment of a drift tube based system used in some designs, the drift tubes 400 are integrated into drift tube modules 500 as in FIG. 5, for example. The tubes 400 in the module 500 can be glued together or mechanically integrated by other means. The tubes 400 integrated into the module 500 are connected to the same electronic unit. In an exemplary embodiment, a single module 500 includes 24 drift tubes 400 arranged in two layers with 12 drift tubes 400 in each layer.

The example illustrated in FIG. 5 further shows that the drift tube modules 500 are integrated mechanically into detection units, also known as supermodules. In an exemplary embodiment, a supermodule contains 12 drift tube modules 500, with 6 drift tube modules 500 oriented along the X direction and 6 drift tube modules 500 oriented along the Y direction, perpendicular to the X direction. In each direction there are 3 layers of the modules 500 separated by the modules 500 oriented in perpendicular direction. Each module 500 can be structurally the same so that all modules 500 are interchangeable. This use of identically constructed modules 500 simplifies fabrication and provides scalable production. The modules 500 in the supermodule are not permanently fixed together and can be separated apart and reintegrated without breaking any modules 500 or any connections between modules 500. In the exemplary embodiment described here there are 12 layers of drift tubes—6 in each direction, with 24 tubes 400 in each layer. The supermodule in this example includes 288 tubes 400 and 12 electronic units (not shown). Electronic units are typically connected together through hubs to reduce the number of external cable connections for the supermodule.

In an exemplary embodiment by using the above detector modules 500, a first particle tracking unit of detectors is located to receive incoming charged particles that transit through an object and to measure a position and a direction of the charged particles that transit through the object while allowing the charged particles to pass through. Also, a second particle tracking sensitive unit of detectors located relative to the first particle tracking detector and to the volume of interest containing the object of inspection enabled to receive the outgoing charged particles that transit through the first particle tracking sensitive unit of detectors and transit through the object of inspection and to measure a position and a direction of the outgoing charged particles.

The first and second tracking sensitive units may then be included a mechanical support structure as an assembly. The assembly may be mobile and the positions of each unit may be adjustable. Two or more of the mobile assemblies may be arranged in a regular geometrical pattern around the object of inspection. The first and second particle tracking sensitive unit of detectors further may comprise drift tubes or other detectors capable of detecting charged particles.

A processor coupled to both the first and second particle tracking sensitive unit of detectors is included to process information from the units to yield an estimate of a spatial map of atomic number and a density of the object.

In an environment that includes a high radiation field the system utilizes coincidence trigger as a filter to separate signals from charged particles from gamma-radiation induced signals. The trigger is implemented in the firmware of the electronic unit attached to the drift tubes. The trigger uses a coincidence within time window between tubes that are connected to the same electronics board. The presence of the more than one signal in the time window is the primary charge particle indicator of the trigger. Geometrical placement of the selected tubes within the module relative to each other and the volume of interest provides the secondary charge particle indicator. The signals from the tubes are identified as generated by the same charged particle when both the primary indicator and secondary indicator are present. The signals that lack either primary or secondary indicator are filtered out by the electronics.

The system disclosed here can be implemented by using different numbers of mobile assemblies depending on the size of the inspected object (typically dry storage cask) and requirements of the inspection. The minimal number of mobile assemblies is two, typically installed on the opposite sides of the object of inspection.

In a typical exemplary embodiment of the system the mobile assemblies are installed around the object of inspection in a regular pattern forming regular geometrical figure (triangle, square, pentagon or hexagon typically), as seen from the above. After the placement the assemblies are secured in place to avoid further movement during the data collection.

In a typical exemplary embodiment the mobile assemblies will be connected together after placement in the appropriate position with rigid metal bars to ensure the rigidity of the system geometry during the data collection. The system may also include portable canopy and plastic enclosures to provide protection against weather extremes, such as snow, strong wind and/or direct sunlight.

The relative position of the sensitive units to each other is determined by the process of geometry calibration based on the measurement of charged particle tracks. The calibration is performed during the data collection process and its results are used for imaging of the object of inspection.

In drift tube based embodiments of the system improved measurement of the particle tracks is achieved with the calibration of time-to-radius conversion function based on the collected data. The calibration is performed iteratively during the data collection process.

The disclosed exemplary embodiments enable a system design that provides 3D imaging of an interrogated volume using cosmic-ray charged particles without any artificial source of radiation.

The typical exemplary object of inspection for this disclosure is a sealed dry storage cask with spent nuclear fuel rods inside. While the system design and implementation is optimized for the use with this particular type of objects, it can be used to image other types of objects as well.

The disclosed system makes use of the information provided by the interaction of charged cosmic ray particles with sensitive detectors generating electrical signals as a reaction to interaction of charged particles with the material of the sensitive detector.

Cosmic rays that are used by the system disclosed here are known also in the literature as secondary cosmic rays. These particles are created in the interactions of primary cosmic rays in atmosphere.

Two major components of secondary cosmic rays at the sea level are electrons and muons. Other charged particles present in the secondary cosmic rays in much smaller quantities are protons, ions, charged mesons, charged heavy baryons and tauons. All of these particles can produce electrical signals if interact with material of sensitive detectors. However, because of their small numbers and relatively low penetrating ability these particles can be ignored during the development and operation of the disclosed system.

High-energy electrons can generate tracks in sensitive detectors similar to tracks produced by muons, however, because of their relatively low penetrating capability the electrons are very unlikely to penetrate heavily shielded dense objects of inspection such as dry storage casks with or without spent fuel rods inside. Because all electrons are stopped in thick objects, they cannot be used for the purposes of the considered application.

Positively and negatively charged muons produced in the interactions of primary cosmic rays in atmosphere provide a sensitive probe to detect and image various materials, including, but not limited to, special nuclear materials. Signals produced in sensitive detectors by the interaction of these muons with material of the sensitive detector is used in the disclosed system for the aforementioned goals.

As a charged particle travels through matter, it loses energy predominately by interaction with the atomic electrons within the material. This energy loss is approximately proportional simply to the effective thickness of electron cloud traversed through the material. Because the charge of these atomic electrons is balanced by an equal number of protons in the atomic nuclei, and because in most cases the number of protons in an atomic nucleus is approximately equal to the number of neutrons, we can say that the thickness of electron cloud traversed is roughly proportional to the mass density of material traversed. Hydrogen atoms are the exception to this, as they do not have a neutron in the nucleus. They will therefore have twice the number of electrons per unit mass.

Detecting and measuring the charged particles as they pass through an object of interest has many applications. In one exemplary application is in detecting nuclear material in spent nuclear fuel casks. Spent nuclear fuel refers to the bundles of uranium pellets encased in metal rods that have been used to power a nuclear reactor. Measurements of the scattering angles of cosmic ray muons which pass through a storage cask can be used to measure the amount of special nuclear material in the cask and determine if spent fuel assemblies are missing without opening the cask.

Figure 3:
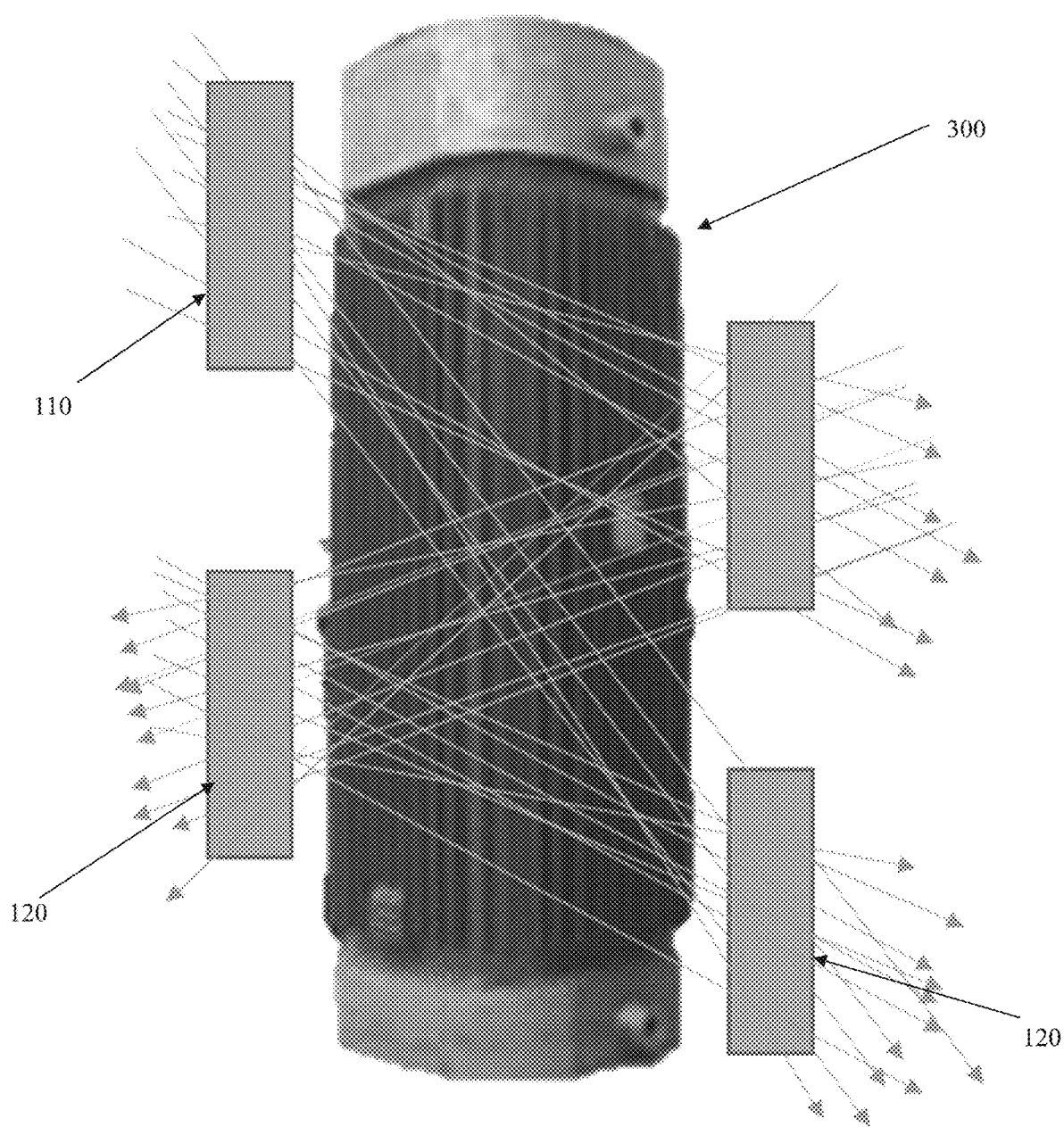
FIG. 3 illustrates schematically an exemplary placement of mobile assemblies in vertical direction as seen from the side.

Referring to FIG. 3, in an exemplary embodiment for implementing the disclosed technical features, two or more first particle tracking units 110 and 120 of detectors are placed near first locations of an object to be detected such as a spent nuclear fuel cask 300 and two or more second particle tracking units 110 and 120 of detectors are placed near second locations of the same object so that those two or more first and second particle tracking units 110 and 120 near the object to be detected or the spent nuclear fuel cask 300 can be paired to detect incident and output charged particles of the object to obtain the images of the objection for inspection.

Specifically as shown in FIG. 3, a first particle tracking unit of detectors 110 is located on the upper left side of the object to be detected such as a spent nuclear fuel cask 300 to receive incoming charged particles 420 that transit through a spent nuclear fuel cask 300. The detectors 400 inside the first particle tracking unit of detectors 110 are enabled to measure a position and direction of the charged particles 420 that transit through the fuel case, for example, while allowing the charged particles 420 to pass through. On the same left side of object to be detected such as a spent nuclear fuel cask 300, another first particle tracking unit of detectors 120 is located lower relative to the first particle tracking unit of detectors 110. On the opposite side relative to the volume of interest such as the spent nuclear fuel cask 300 containing the spent nuclear fuel (not shown), second particle tracking units of detectors 110 and 120 are placed near the spent nuclear fuel cask 30 in such a way as to receive the outgoing charged particles 420 that transit through the first particle tracking unit of detectors 110 and 120 and transit through the cask 300 and the spent nuclear fuel therein and to measure the position and direction of these outgoing charged particles 420.

FIG. 3 further shows that additional particle tracking units of detectors can be placed around the spent nuclear fuel cask 300 to provide additional detection capability. In some implementations, such additional particle tracking units of detectors may be placed around the spent nuclear fuel cask 300 as pairs with the two paired particle tracking units of detectors in each pair being placed in opposite sides of the spent nuclear fuel cask 300. Different pairs can be placed at different locations around the spent nuclear fuel cask 300 in a desired spatial configuration to achieve the desired detection coverage of the radiation coming out of the spent nuclear fuel cask 300. Notably, placing such particle tracking units of detectors on mobile assemblies enable adjustment or movement of the locations of the particle tracking units of detectors around the spent nuclear fuel cask 300 to meet various inspection needs or goals.

FIG. 3 further shows that each particle tracking unit of detectors can be paired with more than one particle tracking unit of detectors on the other side of the object. As an example, particle tracking unit 120 shown on the right side of FIG. 3 is paired with both particle tracking unit 110 and particle tracking unit 120 shown on the left side of FIG. 3. Because all particle tracking units are connected to the processor, and because the signals from all particle tracking units are synchronized in time, and also because the locations of all particle tracking units are known from positional calibration, each of individual particle tracking units can distinguish between muons going through this individual unit and also through any other particle tracking unit installed around the object. Combining particle tracks provided by the different particle tracking units enables a 3D tomographic image reconstruction of the content of the cask.

In operation, the output signals from the particle tracking units of detectors are directed to an image processing and reconstruction module to use the information of measured positions, directions and timing information of incident charged particles such as muons and outgoing charged particles to reconstruct the tomographic profile of scattering centers inside the object to obtain the tomographic images inside the object for inspection.

FIG. 1 shows an example of a mechanical support structure 130 to keep two or more particle tracking unit of detectors such as the first particle tracking unit of detectors 110 and the second particle tracking unit of detectors 120 in desired positions relative to each other where these units can function as described above. The mechanical support structure 130 may be a mobile assembly with supporting wheels for moving around. Such wheels or other moving mechanisms may be motorized for placing the support structure 130 at a desired location near an object to be inspected. The mechanical support structure 130 may include adjustable or movable engagements for mounting the first particle tracking unit of detectors 110 and the second particle tracking unit of detectors 120 to allow for adjustment of their positions such as their heights.

Referring back to FIG. 1, the two particle tracking unit of detectors 110 and 120 on the left hand side of the spent nuclear fuel cask 300 may be mounted to a first mechanical support structure 130 to be placed at a desired location on the left hand side of the spent nuclear fuel cask 300 and the two particle tracking unit of detectors 110 and 120 on the right hand side of the spent nuclear fuel cask 300 may be mounted to a second mechanical support structure 130 to be placed at a desired location on the right hand side of the spent nuclear fuel cask 300 (at different heights as illustrated). The first and second mechanical support structures 130 can be placed at desired known positions and their particle tracking unit of detectors 110 and 120 can be placed at desired known heights so that the four particle tracking unit of detectors 110 and 120 on the two sides of the spent nuclear fuel cask 300 are known and are used to calibrate the imaging processing of measured positions and directions of the charged particles going into and coming out of the spent nuclear fuel cask 300. The calibrated measured positions and directions (incident and output angles) and timing information of the detected charged particles are used to reconstruct the tomographic images inside the region of the object.

A processor (not shown) may be coupled to both the first particle tracking sensitive unit of detectors 110 and the second particle tracking sensitive unit of detectors 120 to process information from both sensitive units to yield an estimate of a spatial map of an atomic number and density of the nuclear fuel inside the cask. A method of data processing in the electronics may further include filtering out signals not identified as belonging to charged particle tracks. A first indicator is based on the timing coincidence of the signals within the coincidence window. The coincidence window size can be further set independently for each module in the firmware of each relevant electronic unit. The coincidence window size is further optimized based on the timing properties of the sensitive detectors in the module and ambient radiation field at the position of the module placement. A second indicator is further based on the positions of the selected sensitive detectors. The second indicator is further optimized based on the position of selected sensitive detectors within the module and relative position of the module relative to the object of inspection.

The mechanical support structure 130 may also include two or more mobile assemblies 100 providing mobility and support for two sensitive units of detector 110, 120 each, installed in a vertical orientation on top of one another, with a gap between them as in the exemplary embodiment of FIG. 1. Other mechanical elements providing geometrical rigidity to the set of mobile assemblies during the inspection and other mechanical elements providing weather protection for mobile mechanical assemblies to insure the system operation under variable outdoor weather conditions.

The other mechanical elements may include rigid metal bars interconnecting mobile assemblies to provide enhanced geometrical rigidity of the system and the mobile assemblies are further arranged in a regular geometrical pattern around the object of inspection.

Other mechanical elements further include portable canopy or canopies for weather protection of mobile assemblies 100. The mounting height of top sensitive units within the mobile assembly is further mechanically adjustable. The size of the gap between two sensitive units of detectors in the same mobile assembly 100 is mechanically adjustable.

Figure 2:
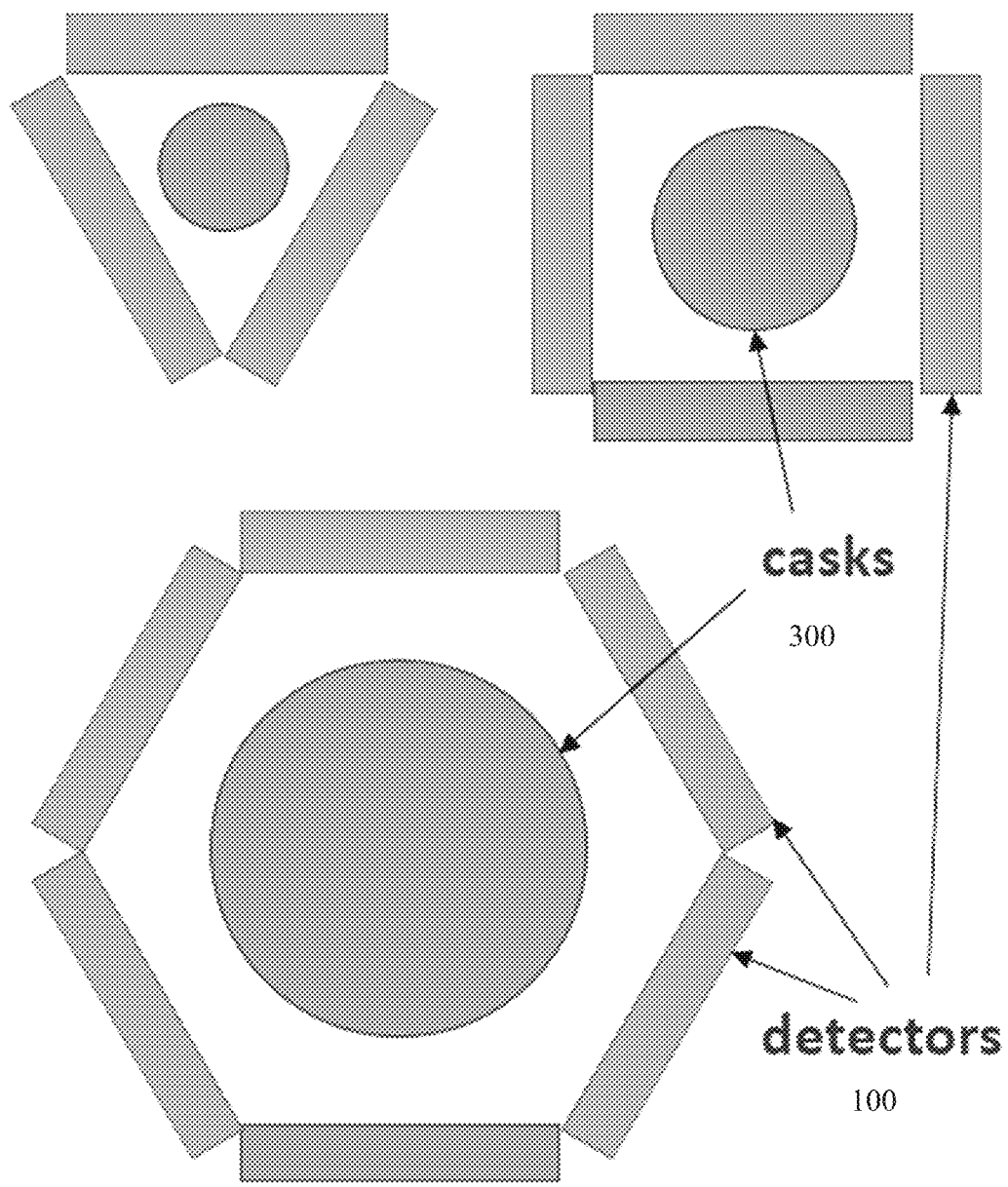
FIG. 2 illustrates schematically an exemplary placement of mobile assemblies around the object of inspection as seen from above.

As shown in FIG. 2 for example, the number of mobile assemblies 100 in the system is chosen based on the size of the object of inspection and other inspection requirements. The mobile assemblies 100 are positioned around the object of inspection 300 before the start of data collection. The geometry calibration may be based on collected measurements of incoming and outgoing particle tracks. An iterative calibration of time-to-radius response function for each drift tube detector in the system may be performed. In other embodiments, support subsystems necessary to assure reliable operation of subsystems described above may be included.

In one exemplary embodiment, the charged particle detectors further comprise drift tubes 400. The mounting heights for the sensitive unit are chosen based on modeling of the incoming cosmic ray muon flux and inspection requirements. The charge particles are further identified within each module based on two indicators of particle tracks.

Other charged particle detectors may further include silicon wafer, thin-gap chamber (TGC) and Thick Gas Electron Multiplier (THGEM) detectors.

To work in a high radiation field the system utilizes coincidence trigger as a filter to separate signals from charged particles from gamma-radiation induced signals. The trigger is implemented in the firmware of the electronic unit attached to the drift tubes. The trigger uses a coincidence within time window between tubes that are connected to the same electronics board. The presence of the more than one signal in the time window is the primary charge particle indicator of the trigger. Geometrical placement of the selected tubes within the module relative to each other and the volume of interest provides the secondary charge particle indicator. The signals from the tubes are identified as generated by the same charged particle when both the primary indicator and secondary indicator are present. The signals that lack either primary or secondary indicator are filtered out by the electronics.

The coincidence time window size is set in the electronics by command. Exact time window size is optimized depending on gas properties and ambient radiation field strength. As an example, the coincidence window size can be 500 ns for drift-tube based detection system. The coincidence window size can be the same or different for different drift tube modules in the same system.

The secondary indicator used by the charged particle trigger is configurable. It is optimized based on relative positions of the tubes within the module and placement of the module relative to the volume of interest. In an exemplary embodiment of the system, the selected tubes in the module can be required to be from different layers. Typically, more complicated selection criteria will be implemented. Selection criteria can be the same or different for different modules in the same system.

The sensitive units (supermodules) 500 of the system are installed on the mobile platforms 100, as in FIG. 1 and as shown in FIG. 5, to allow inspection and imaging of the volume of interest 300 without moving objects of inspection (typically dry storage casks) within the volume of interest.

Each mobile platform of the disclosed system carries two sensitive units (supermodules) 500 installed vertically, one on top and another on the bottom, with a gap separating them in vertical direction. Heights of both supermodules 500 can be changed, and size of the gap can vary as well. In one exemplary embodiment of the system the supermodules 500 are approximately square in section, and made of the 4-foot long tubes. The gap between the supermodules 500 can be 4 feet in vertical direction, and whole mobile assembly can be 12 foot tall or more. These numbers are only quoted here as an example, and actual numbers can be significantly different for particular embodiments of the system.

The height of mounting can be adjusted for each supermodule 500. This height can be adjusted or optimized for particular embodiment of the system and particular object of inspection. The optimization is done based on the size of the object of inspection and modeling of the cosmic-ray flux directional distribution relative to the zenith angle.

The system disclosed here can include different numbers of mobile assemblies 100 depending on the size of the inspected object 300 (typically dry storage cask) and requirements of the inspection. The minimal number of mobile assemblies is two, typically installed on the opposite sides of the object of inspection.

In a typical exemplary embodiment of the system the mobile assemblies 100 are installed around the object of inspection in a regular pattern forming regular geometrical figure (triangle, square, pentagon or hexagon typically), as seen from the above and as in FIG. 2, for example. After the placement the assemblies are secured in place to avoid further movement during the data collection.

Figure 6A:
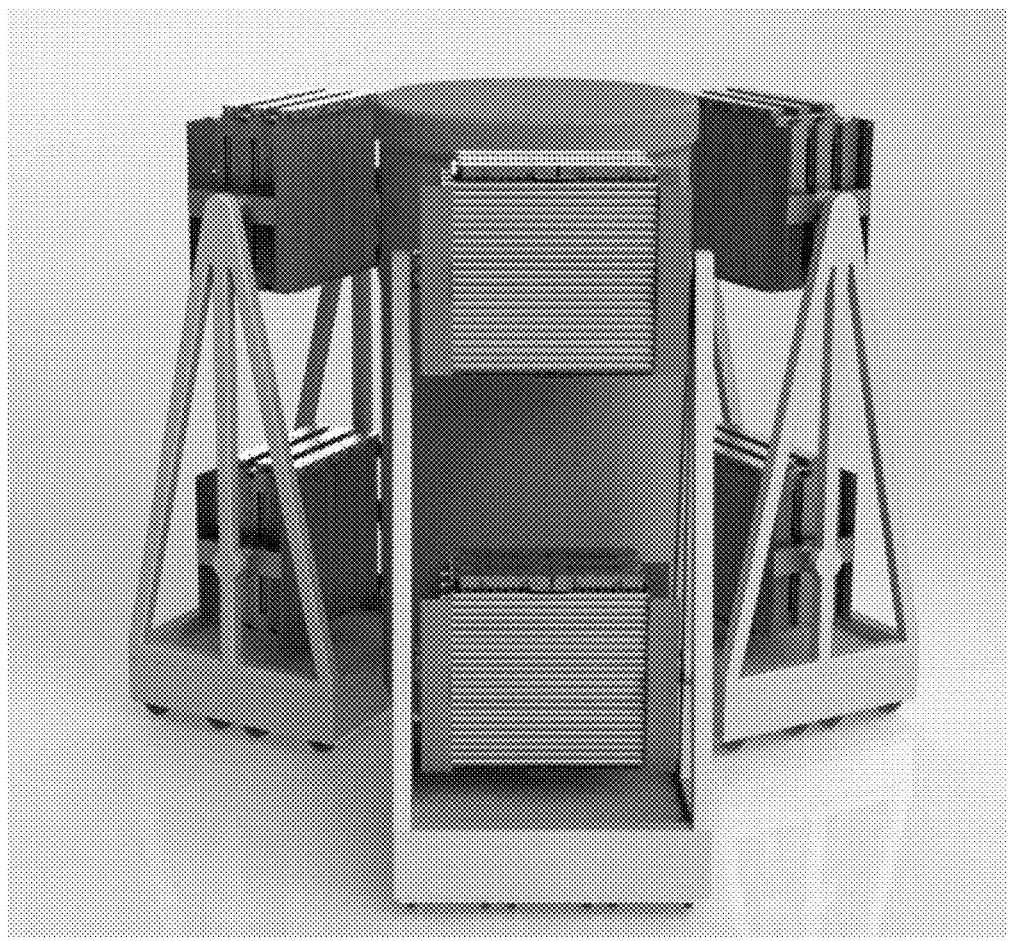
FIGS. 6A and 6B show two different views of an example arrangement of the mobile assemblies with charged particle detectors that are placed on three sides of an object 300 to be inspected in a triangular geometry.
Figure 6B:
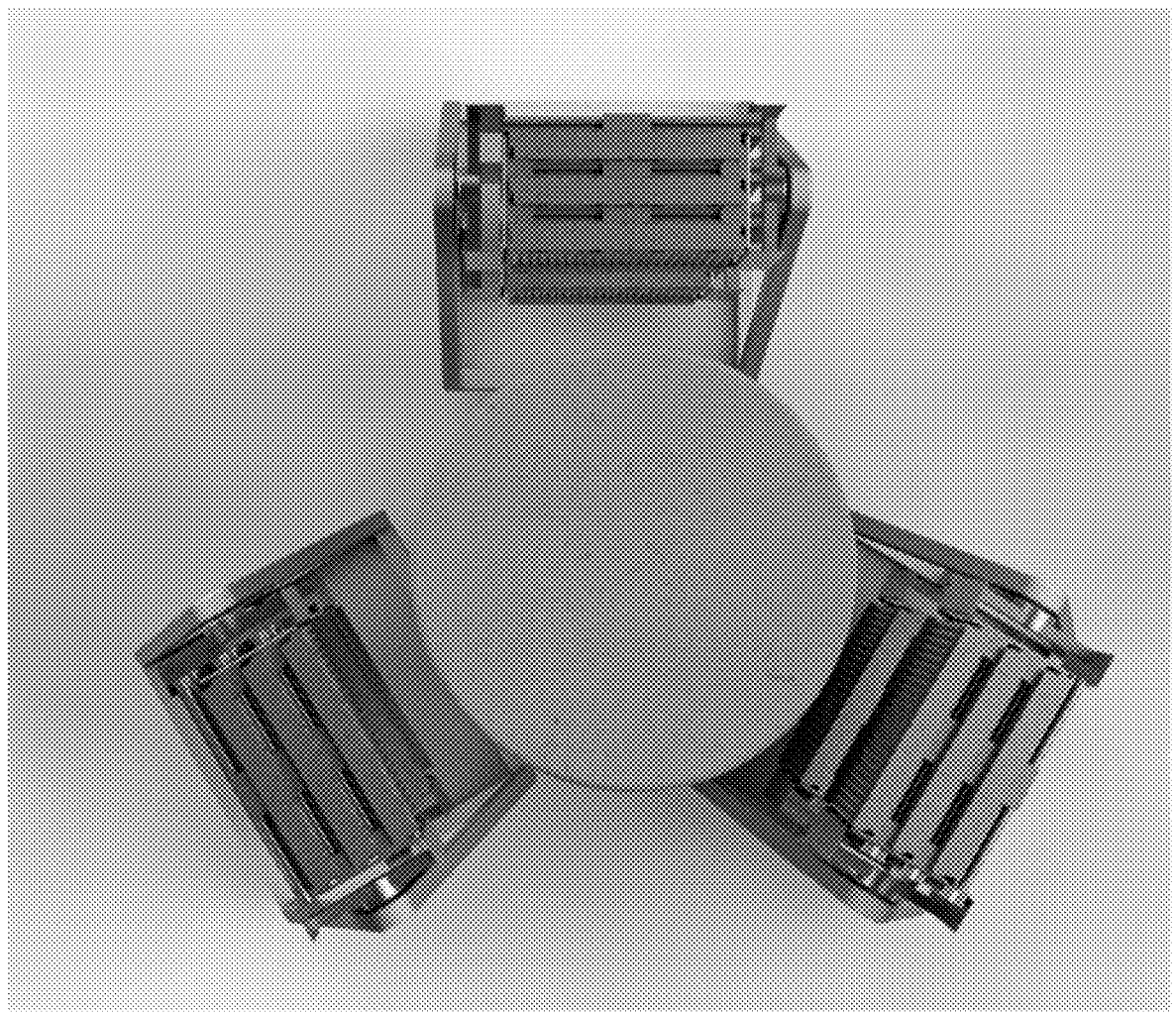

Specifically, three different examples are illustrated in FIG. 2. The first example is shown on the upper left side in FIG. 2 where the mobile assemblies 100 with charged particle detectors are placed on the three sides of an object 300 to be inspected. Two different views of this example are shown in FIGS. 6A (a perspective side view) and 6B (a top view). The second example is shown on the upper right side in FIG. 2 where the mobile assemblies 100 with charged particle detectors are placed on the four sides of an object 300 to be inspected. The third example is shown on the lower side in FIG. 2 where the mobile assemblies 100 with charged particle detectors are placed on six sides of an object 300 to be inspected.

In a typical exemplary embodiment the mobile assemblies 100 will be connected together after placement in the appropriate position with rigid metal bars to ensure the rigidity of the system geometry during the data collection. The system may also include portable canopy and plastic enclosures to provide protection against weather extremes, such as snow, strong wind and/or direct sunlight.

The relative position of the sensitive units to each other is determined by the process of geometry calibration based on the measurement of charged particle tracks. The calibration is performed during the data collection process and its results are used for imaging of the object of inspection.

Referring to FIG. 4, in drift tube based embodiments of the system improved measurement of the particle tracks is achieved with the calibration of time-to-radius conversion function based on the collected data. The calibration is performed iteratively during the data collection process.

In this patent document, the word "exemplary" is used to mean serving as an example, instance, or illustration. Any embodiment or design described herein as "exemplary" is not necessarily to be construed as preferred or advantageous over other embodiments or systems. Rather, use of the word exemplary is intended to present concepts in a concrete manner. The mounting height of bottom sensitive units within the mobile assembly is further mechanically adjustable.

The disclosed and other embodiments and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An apparatus for inspecting and imaging contents of a volume of interest comprising:
    a first particle tracking unit of detectors located to receive incoming charged particles that further transit through an object of inspection contained in the volume of interest;
    a second particle tracking unit of detectors located lower relative to the first particle tracking unit of detectors and on a side of the volume of interest opposite the first particle tracking unit of detectors, enabled to receive the charged particles that transit through the first particle tracking unit of detectors and transit through the object and to measure a position and a direction of each charged particle;
    a mechanical support structure to keep both the first particle tracking unit of detectors and the second particle tracking unit of detectors in position wherein the first and second particle tracking units of detectors are enabled to receive the charged particles; and
    a processor coupled to both the first particle tracking unit of detectors and the second particle tracking unit of detectors to process information from the first and second particle tracking units of detectors to yield an estimate of a spatial map of an atomic number and a density of the object,
    wherein the mechanical support structure further comprises at least two mobile assemblies to provide mobility and support for the first and second particle tracking units of detectors, the mechanical support structure being structured to be in a generally vertical orientation to hold the at least two mobile assemblies at different vertical positions so that the first particle tracking unit of detectors is positioned higher than the second particle tracking unit of detectors, the mechanical support structure enabled to provide geometrical rigidity to the at least two mobile assemblies during the inspection.

2. The apparatus of claim 1, further including at least one rigid metal bar interconnecting the at least two mobile assemblies to enhance a geometrical rigidity of the mechanical support structure.

3. The apparatus of claim 1, wherein the at least two mobile assemblies are further arranged in a regular geometrical pattern around the object of inspection.

4. The apparatus of claim 1, further including at least one portable canopy for weather protection of the at least two mobile assemblies.

5. The apparatus of claim 1, wherein one of the two mobile assemblies is structured so that a mounting height of first particle tracking unit within the mobile assembly is mechanically adjustable.

6. The apparatus of claim 1, wherein one of the two mobile assemblies is structured so that the mounting height of the second particle tracking sensitive unit within the mobile assembly is mechanically adjustable.

7. The apparatus of claim 1, wherein the size of the gap between the first and second particle tracking units in the same mobile assembly is mechanically adjustable.

8. The apparatus of claim 1, wherein the first and second particle tracking units further comprise drift tubes for detecting charged particles.

9. The apparatus of claim 1, further including a coincidence trigger as a filter to separate signals from the charged particles from gamma-radiation induced signals.

10. A method of operating an inspection apparatus, the method comprising:
    positioning an assembly of the first and second particle tracking sensitive units of detectors around the object of inspection to form a system of particle tracking sensitive units by using first and second mobile support structures to hold the first and second particle tracking sensitive units of detectors, respectively, to allow for adjustment of positions of the first and second particle tracking sensitive units of detectors;
    receiving at a first particle tracking sensitive unit of detectors, incoming charged particles that further transit through an object of inspection and through a second particle tracking sensitive unit of detectors located lower relative to the first particle tracking detector and to a volume of interest containing the object of inspection;
    measuring a position and a direction of each of the charged particles that transit through the object and the first and second particle tracking sensitive units;
    collecting the position and the direction of a plurality of charged particles;
    processing the position and the direction of the plurality of charged particles as numerical data based on electrical signals generated in the first and second particle tracking sensitive unit of detectors;
    determining points of interaction of each charged particle with the first and second particle tracking sensitive unit of detectors;
    approximating an incoming trajectory of each charged particle with a straight line based on the determined points of interaction of each charged particle with the first particle tracking sensitive units;
    approximating an outgoing trajectory of each charged particle with a straight line based on the determined points of interaction of each charged particle with the second particle tracking sensitive unit of detectors; and
    reconstructing a spatial map of material properties based on densities and radiation lengths of the object in the volume of interest and based on the collection of incoming and outgoing particle trajectories.

11. The method of claim 10, wherein the number of assemblies in the system is chosen based on a size of the object of inspection.

12. The method of claim 10, wherein a mounting height of the first and second particle tracking sensitive unit of detectors is chosen based on a model of incoming cosmic ray muon flux and a position of the volume of interest relative to the first and second particle sensitive tracking units.

13. The method of claim 10, further including a geometry calibration based on collected measurements of incoming and outgoing trajectories of the plurality of charged particles.

14. The method of claim 10, wherein the first and second particle tracking sensitive unit of detectors comprise a plurality of drift tubes and performing an iterative calibration of time-to-radius response function for each drift tube of the plurality of drift tubes.

15. The method of claim 10, further including filtering out signals not belonging to the measured charged particles.

16. The method of claim 15, wherein the charge particles are further identified within each assembly based on two indicators of the measured charged particles.

17. The method of claim 16, wherein a first indicator is further based on a timing coincidence of the measured charged particles within a coincidence window.

18. The method of claim 17, wherein the coincidence window size can be further set independently for each assembly.

19. The method of claim 18, wherein the coincidence window size is further optimized based on a timing property of the first and second particle tracking sensitive unit of detectors and an ambient radiation field at a position of the first and second particle tracking sensitive unit of detectors.

20. The method of claim 16, wherein a second indicator is further based on positions of the first and second particle tracking sensitive units.

21. The method of claim 20, wherein the second indicator is further optimized based on a position of a selected drift tube within the assembly and relative a position of the assembly relative to the object of inspection.

* * * * *